United States Patent [19]

Paterson

[11] Patent Number: 5,057,447
[45] Date of Patent: Oct. 15, 1991

[54] SILICIDE/METAL FLOATING GATE PROCESS

[75] Inventor: James L. Paterson, Richardson, Tex.

[73] Assignee: Texas Instruments Incorporated, Dallas, Tex.

[21] Appl. No.: 549,862

[22] Filed: Jul. 9, 1990

[51] Int. Cl.[5] .................................... H01L 21/70
[52] U.S. Cl. ...................................... 437/43; 437/47; 437/52; 437/60; 437/192; 437/195; 437/200; 437/919
[58] Field of Search ................. 437/43, 47, 48, 51, 437/52, 60, 191, 192, 193, 195, 200, 228, 233, 235; 357/23.5

[56] References Cited

U.S. PATENT DOCUMENTS

| 4,198,693 | 4/1980 | Kuo | 365/104 |
|---|---|---|---|
| 4,203,125 | 5/1980 | Chatterjee et al. | 357/41 |
| 4,288,256 | 9/1981 | Ning et al. | 435/193 |
| 4,410,867 | 10/1983 | Arcidiacono et al. | 333/172 |
| 4,419,812 | 12/1983 | Topich | 29/571 |
| 4,466,177 | 8/1984 | Chao | 29/571 |
| 4,472,726 | 9/1984 | DiMaria et al. | 357/6 |
| 4,589,056 | 5/1986 | Stimmell | 361/311 |
| 4,606,114 | 8/1986 | Kraus | 29/571 |
| 4,613,956 | 9/1986 | Paterson et al. | 357/54 |
| 4,619,887 | 10/1986 | Hooper et al. | 430/313 |
| 4,628,405 | 12/1986 | Lippert | 361/321 |
| 4,630,086 | 12/1986 | Sato et al. | 357/23.5 |
| 4,635,347 | 1/1987 | Liem et al. | 437/43 |
| 4,638,400 | 1/1987 | Brown et al. | 361/304 |
| 4,683,554 | 7/1987 | Lockwood et al. | 357/23.5 |
| 4,686,000 | 8/1987 | Heath | 357/23.5 |
| 4,700,457 | 10/1987 | Matsukawa | 437/52 |
| 4,732,872 | 3/1988 | Komatsu | 437/47 |
| 4,734,887 | 3/1988 | Sugatami | 357/23.5 |
| 4,760,034 | 7/1988 | Barden | 437/47 |
| 4,768,080 | 8/1988 | Sato | 357/54 |
| 4,799,992 | 1/1989 | Rao et al. | 156/643 |
| 4,825,271 | 4/1989 | Tamaka et al. | 357/23.5 |

FOREIGN PATENT DOCUMENTS

| 0105351 | 6/1984 | Japan . | |
| 0022355 | 2/1985 | Japan . | |
| 60-148168 | 5/1985 | Japan | 29/78 |
| 0001262 | 6/1987 | Japan . | |
| 0094664 | 4/1988 | Japan . | |

OTHER PUBLICATIONS

*Stacked Gate Device with Reduced "0" State Threshold Voltage;* Jambotkar et al., pp. 160–161, Jun. 1979, U.S. (IBM Technical Disclosure Bulletin; vol. 22, No. 1).

*Reversible Floating-Gate Memory;* Card et al., pp. 2326–2330, May 1973, U.S. (Journal of Applied Physics; vol. 44, No. 5).

*Single Level Poly Capacitors for High Precision A/D Converters;* Kaya et al., pp. 782–785, 1988, U.S. (IEDM Technical Digest; Paper No. 33.5).

U.S. Appl. Ser. No. 189,930, A Metal-to-Polysilicon Capacitor and Method for Making the Same, Filed 05/03/88; Applicant J. L. Paterson.

*Primary Examiner*—Brian E. Hearn
*Assistant Examiner*—Tom Thomas
*Attorney, Agent, or Firm*—Melvin Sharp; James T. Comfort; N. Rhys Merrett

[57] ABSTRACT

The invention provides an integrated circuit capacitor with a silicided polysilicon electrode (which silicide has not been used as an etch stop) as a bottom plate and a metal layer as a top plate. Subsequent to the formation of a patterned polysilicon layer, a multilevel dielectric is formed, and a via is etched therethrough to a polysilicon capacitor bottom plate. Then the polysilicon bottom plate is clad with a refractory metal silicide. The capacitor dielectric is then deposited, such a dielectric preferably consisting of an oxide/nitride layered dielectric. Contacts are etched to diffusion and to polysilicon electrodes as desired, and metal is deposited and patterned to form the top electrode of the capacitor over the capacitor dielectric, and to make contact as desired to diffusion and to polysilicon. This provides an improved silicide layer in the capacitor, as compared to processes which etch through oxide down to the silicide, and thus are using the silicide as an etch stop.

6 Claims, 7 Drawing Sheets

SILICIDE/METAL FLOATING GATE PROCESS

CROSS REFERRENCE TO RELATED APPLICATIONS

A metal-to-polycide capacitor is described in pending application Ser. No. 189,930 filed 5/3/88, assigned to the same assignee. That copending application silicides prior to application of a multilayer dielectric and later etches through the multilayer dielectric down to the silicide.

BACKGROUND OF THE INVENTION

In the field of integrated circuits, it is preferable to form circuit elements in the smallest achievable surface area, in order to realize a high degree of circuit complexity into a small integrated circuit chip size, resulting in lower cost per function. For circuits containing capacitors, such as those required in analog-to-digital convertors (ADCs) and in non-volatile memories which use capacitive coupling between a control gate and a floating gate, the goal of large scale integration requires the provision of capacitors which are small in cross-sectional area but large in capacitance. Especially in the field of ADCs, the stability of the capacitance value over a range of applied voltage, and over a given temperature range, is additionally important in providing fast and accurate conversion.

Another consideration in the cost of fabricating integrated circuits is the complexity of the fabrication process. The process complexity can be increased in an attempt to save surface area by increasing the number of interconnect levels. For example, the surface area of a given integrated circuit may be reduced by using two, rather than one, levels of polysilicon gates and interconnects, under the overlying metallization layer(s). However, the process complexity is increased by including the additional polysilicon layer due to the added process steps of the deposition of an additional polysilicon layer, deposition of an additional dielectric layer, and patterning and etching the additional polysilicon layer and contacts thereto.

Furthermore, additional high temperature process steps performed after the formation of diffused junctions are detrimental to the ability to scale the transistors in an integrated circuit, as the additional high temperature steps cause the diffused dopants used in junction formation to further diffuse, resulting in deeper junctions and wider lateral diffusion.

It is therefore an object of this invention to provide a capacitor which has a high specific capacitance, and therefore a high capacitance to surface area ratio, in particular as provided by a high quality silicide layer on the top of the bottom plate of the capacitor.

It is another object of this invention to provide a method of forming such a capacitor.

It is another object of this invention to provide such a method which requires relatively low temperature processing.

It is another object of this invention to provide such a method requiring only a single level of polysilicon to form the capacitor.

It is another object of this invention to provide such a capacitor having a low voltage coefficient of capacitance.

Other objects and advantages of the invention will become apparent to those of ordinary skill in the art having reference to the following description, in conjunction with the drawings.

SUMMARY OF THE INVENTION

The invention provides an integrated circuit capacitor with a silicided polysilicon electrode (which silicide has not been used as an etch stop) as a bottom plate and a metal layer as a top plate. Subsequent to the formation of a patterned polysilicon layer, a multilevel dielectric is formed, and a via is etched therethrough to a polysilicon capacitor bottom plate. Then the polysilicon bottom plate is clad with a refractory metal silicide. The capacitor dielectric is then deposited, such a dielectric preferably consisting of an oxide/nitride layered dielectric. Contacts are etched to diffusion and to polysilicon electrodes as desired, and metal is deposited and patterned to form the top electrode of the capacitor over the capacitor dielectric, and to make contact as desired to diffusion and to polysilicon. This provides an improved silicide layer in the capacitor, as compared to processes which etch through oxide down to the silicide, and thus are using the silicide as an etch stop.

In one structure of this invention, a floating-gate transistor is formed at a surface of a semiconductor body. The structure comprises: a field dielectric on non-moat portions of the surface; a source diffusion at the moat; a drain diffusion at the moat; a floating gate, comprising polycrysatalline silicon, having a capacitor bottom plate section disposed over the field dielectric, and having a gate portion extending off of the field dielectric and disposed between the source and drain diffusions; a silicide film, disposed on only a portion of the top surface of the capacitor bottom plate section (silicide is possibly also on the source and drain diffusions, but only on contact areas); a multilevel dielectric, disposed over the semiconductor body surface away from the capacitor bottom plate section; a capacitor dielectric layer, disposed over and in contact with the silicide film at the capacitor bottom plate section, and disposed over the multilevel dielectric away from the capacitor bottom plate section; and a patterned conductor layer, comprising a metal layer, with a first portion, comprising a control gate, disposed over and in contact with the capacitor dielectric layer at the capacitor bottom plate section, and a second portion disposed over and in direct contact with at least one of the source diffusion and the drain diffusion.

Preferably in the floating-gate transistor, the control gate comprises: a first metal layer in contact with the capacitor dielectric; and a second metal layer in contact with the first metal layer, with the first metal layer preferably comprising titanium and tungsten and the capacitor dielectric comprising silicon dioxide and silicon nitride, with the layer of silicon nitride overlying the layer of silicon dioxide.

In one method of this invention for fabricating a floating-gate transistor at a surface of a semiconductor body, the method comprising the steps of: forming a field dielectric structure at the surface, to define a moat region not covered by the field dielectric structure; forming a source diffusion and a drain diffusion at the moat region; forming a floating gate, comprising polycrystalline silicon, the floating gate having a capacitor bottom plate section disposed over the field dielectric structure, and having a gate portion extending off of the field dielectric and disposed between the source and drain diffusions; forming a multilevel dielectric layer overall; removing a portion of the multilevel dielectric layer over the capacitor bottom plate section to expose a portion thereof (possibly also removing portions of the multilevel dielectric layer over the source and drain diffusions, but only on contact areas); forming a silicide film on the exposed portion of the capacitor bottom plate section (and possibly the source and drain contact areas); forming a capacitor dielectric overall; removing a portion of the capacitor dielectric and the multilevel dielectric layer, (or only the dielectric layer, if the multilevel dielectric layer over the source and drain diffusion contact areas had previously been removed) over the moat region to expose a portion thereof; and forming a patterned conductor layer, comprising a metal layer, with a first portion comprising a top plate disposed over and in contact with the capacitor dielectric layer at the capacitor bottom plate section, and a second portion disposed over and in direct contact with at least one of the source diffusion and the drain diffusion.

In the method, the step of forming the top plate preferably comprises: forming a first metal layer in contact with the capacitor dielectric prior to the step of removing a portion of the multilevel dielectric layer over the moat region; and forming a second metal layer in contact with the first metal layer after the step of removing a portion of the multilevel dielectric layer over the moat region, wherein the second metal layer is in direct contact with the exposed portion of the moat region. Preferably the first metal layer comprises titanium and tungsten. Preferably the step of forming a capacitor dielectric comprises: forming a layer of silicon dioxide overall; and forming a layer of silicon nitride over the layer of silicon dioxide, with the depositing steps being performed by way of low pressure chemical vapor deposition.

DETAILED DESCRIPTION OF THE PREFERRED EMBODIMENT

Figure 1:
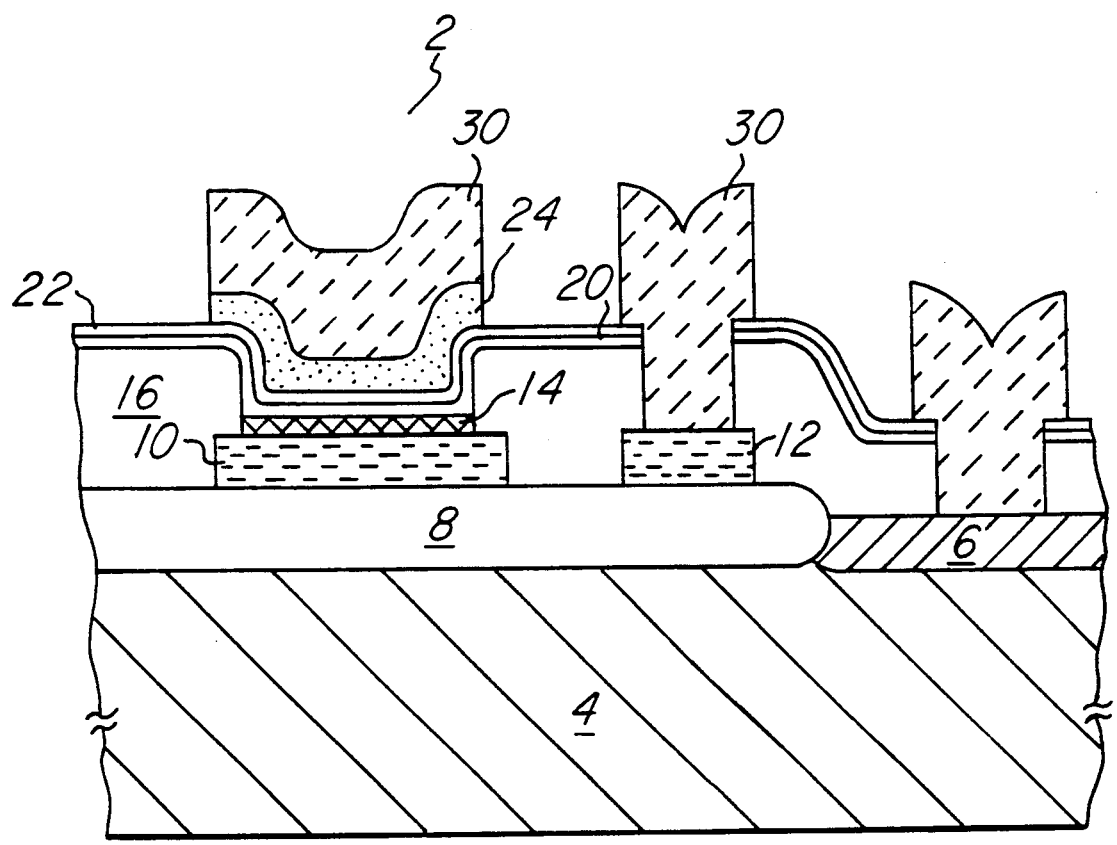
FIG. 1 is a cross-sectional diagram of a completed capacitor constructed according to the preferred embodiment of the invention.

Referring to FIG. 1, a cross-sectional diagram of a metal-to-polysilicon capacitor 2 constructed according to the invention is shown. Capacitor 2 is formed in this embodiment on top of field oxide 8 which is disposed at the surface of p-type substrate 4. Capacitor 2 has a lower plate formed of polycrystalline silicon which, in this embodiment, is clad with a refractory metal silicide 14. Such cladding also provides for additional stability of the capacitor 2. The capacitor dielectric for capacitor 2 consists of a layer of silicon dioxide 20 underlying a layer of silicon nitride 22. The embodiment shown in FIG. 1 having a 25 nm thickness for oxide 20 and a 25 nm thickness for nitride 22 provides a specific capacitance of approximately 1 fF per square micron. The top plate of capacitor 2 preferably consists of a titanium-tungsten alloy layer 24 underlying an aluminum, or aluminum alloy, layer 30. The provision of layer 24 facilitates fabrication of capacitor 2, as will be explained hereinbelow, but is not essential in the construction of capacitor 2. Layers 24 and 30 may be alternatively formed of any one of a number of standard metals used in metallization of integrated circuits, such as pure aluminum, doped aluminum (such as copper-doped aluminum and silicon-doped aluminum), or a multilayer metal system such as one composed of a layer of an alloy of titanium-tungsten underlying a layer of copper-doped aluminum.

It has been found that capacitor 2 constructed as a metal-to-poly capacitor as shown in FIG. 1 has reduced, and thereby improved, coefficients of capacitance to voltage, and capacitance to temperature, as compared with poly-to-poly capacitors. This stability is further improved where the underlying polysilicon is clad with a silicide film. As will be further evident hereinbelow in the description of the method used to form capacitor 2, the formation of the dielectric and top plate of capacitor 2 may be done at relatively low temperatures, as compared to the formation of modern poly-to-poly capacitors.

The previous method used for producing a metal-to-polycide capacitor is described in pending application Ser. No. 189,930 filed May 3, 1988. In the previous design the silicide film is formed on the top surfaces of poly layers 10 and 12, and diffusion region 6 before the multilevel dielectric 16 is deposited. The silicide covers the complete surface area of layers 10, 12, and 6. After the silicide has been formed, multilevel dielectric 16 is deposited. Then capacitor opening 18 is etched in layer 16 to the surface of the silicide film on poly region 10. Then the dielectric layers 20 and 22 are deposited to form the capacitor spacing. The remaining steps of the process are similar to those of the new design, shown in FIG. 1, which are described in detail below.

One advantage of the new design in FIG. 1 is that the silicide film 14 in the capacitor 2 is formed later in the process than in the previous design described above. In the previous design, the silicide film is formed before layer 16 and, therefore, before the capacitor opening 18 is etched. Since the capacitor opening in the old design is etched down to the surface of the silicide film, some of the silicide film may be etched away while etching the capacitor opening 18. This is an undesirable side effect. The advantage of this new method is that the capacitor opening 18 is etched before the silicide is formed, therefore, none of the silicide film is lost when the capacitor opening 18 is formed. The new capacitor 2 has a better silicide film 14 and a better capacitor than in the previous design of FIG. 1. Also, this is a method for adding a metal-to-polycide capacitor to a flow which otherwise does not have silicided gates.

Figure 2A:
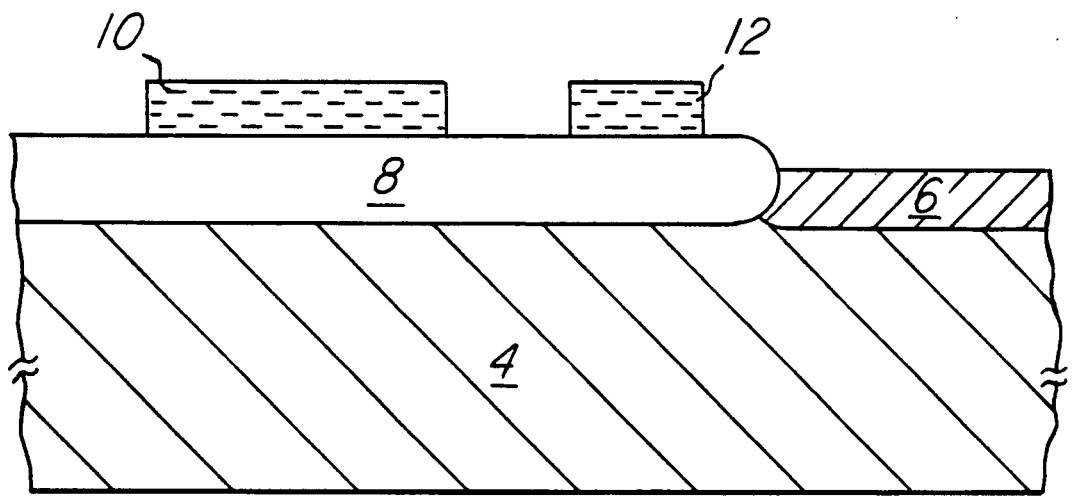
FIGS. 2a through 2j are cross-sectional diagrams illustrating various steps in the formation of the capacitor of FIG. 1.

Referring to FIGS. 2a through 2j, a method of forming capacitor 2 of FIG. 1 will be described in detail. FIG. 2a illustrates, in cross-section, a partially fabricated integrated circuit, formed into a p-type substrate 4. Field oxide structures 8 are formed in a manner well known in the art, such as the well known local oxidation (LOCOS) method. A polycrystalline layer is deposited overall, and is patterned and etched to form polysilicon structures 10 and 12. As described above, polysilicon structure 10 will serve as the bottom plate of capacitor 2; polysilicon structure 12 is a structure unrelated to capacitor 2, but which is shown here for explanatory purposes. The polysilicon layer used in the formation of structures 10 and 12 is preferably heavily doped so as to be relatively conductive, as in conventional integrated circuits; generally, the polysilicon layer will be doped n-type, and will be either implanted with n- type dopant, or may be in- situ doped during its deposition. N-type diffusion 6 is formed by way of ion implantation and subsequent diffusion into a location of the surface of p-type substrate 4 not covered by field oxide 8; diffusion 6 is generally formed after the formation and patterning of the polysilicon layer described above to form source and drain regions of MOS transistors in self- aligned fashion with the polysilicon gate electrode.

Figure 2B:
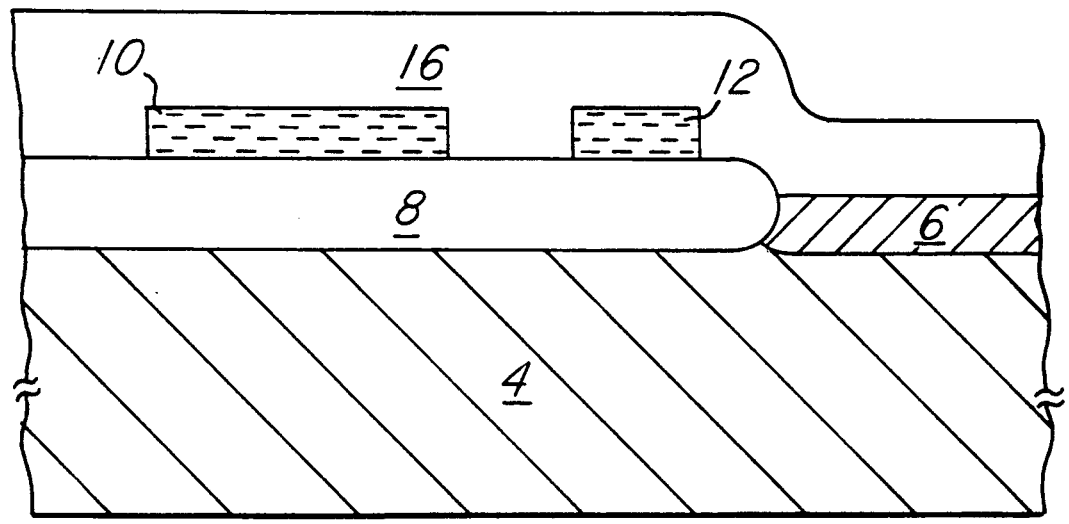
Figure 2C:
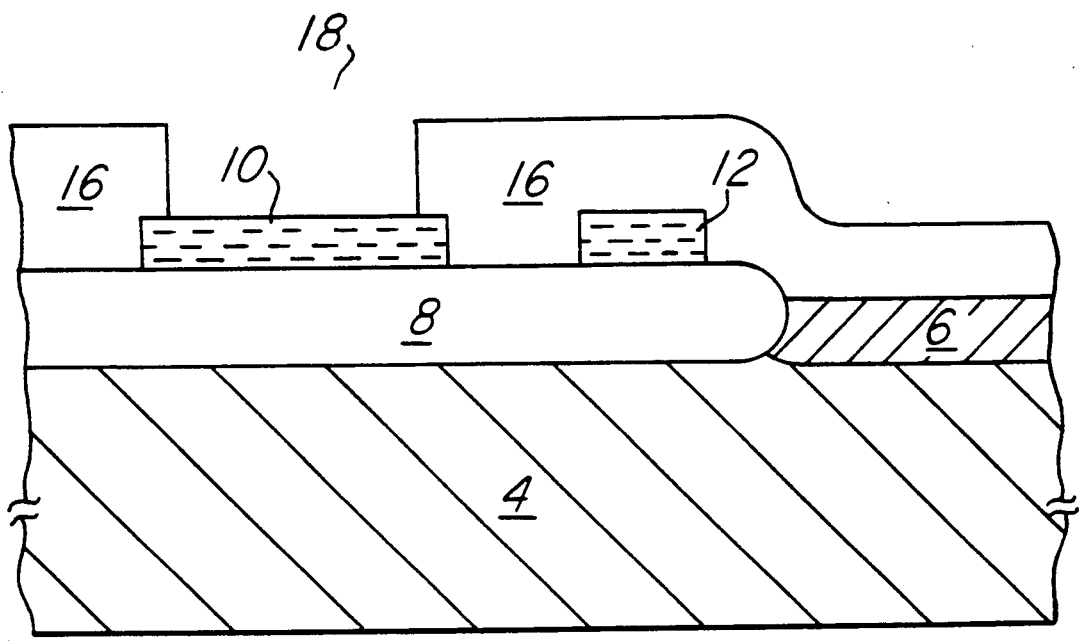
Figure 2D:
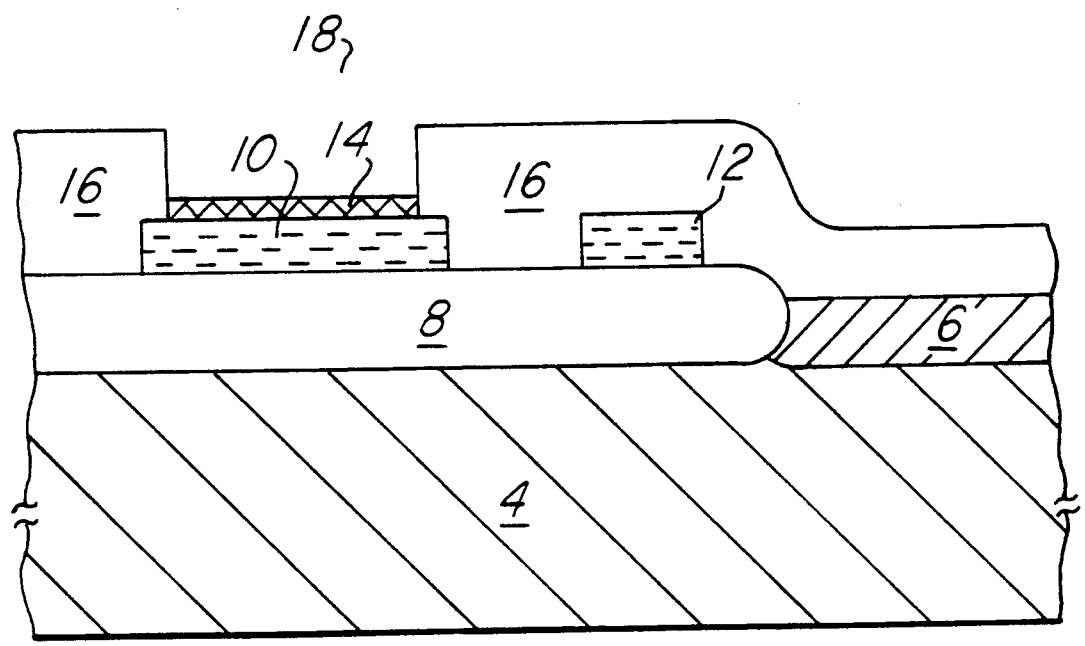

A layer of multilevel dielectric 16 is deposited over the surface of the integrated circuit, as shown in FIG. 2b. Multilevel 16 may be a conventional dielectric material used for insulation of polysilicon layers from overlying metallization. An example of a conventional multilevel dielectric 16 is phosphorous-doped silicon dioxide. Via 18 is then formed through multilevel 16 to polysilicon 10 at the location where capacitor 2 is to be formed, as shown in FIG. 2c. It should be noted that via 18 is not formed at the same time as contact vias to polysilicon structure 12 or to diffusion 6; such contacts will be formed later as described hereinbelow. Via 18 is patterned according to conventional photolithography techniques, and etched by conventional wet or plasma etches for the particular material of multilevel 16.

The silicide film is formed by the deposition of a refractory metal such as titanium, molybdenum, or any refractory metal used in the art for silicide-cladding, followed by annealing to cause the direct reaction of the refractory metal with the underlying silicon to form silicide film 14, such direct react silicidation being well known in the art. The unreacted refractory metal or refractory metal compounds overlying multilevel dielectric 16 are subsequently removed, leaving the structure shown in FIG. 2d. As mentioned above, the voltage stability of capacitor 2 is enhanced by the silicidation of polysilicon electrode 10.

Alternatively, contact vias 26 and 28 can be formed at the same time as via 18. Then the silicide film will also be formed at the surface of poly silicon structure 12 and diffusion 6 in the contact openings. This process will provide a silicide film on layers 12 and 6 similar to the silicide film formed in the capacitor opening 18 on layer 10. Since the silicide has no significant effect on the contacts, silicide is optional on layers 12 and 6. The remaining steps in the process will be the same regardless of whether vias 26 and 28 are formed when via 18 is formed.

Figure 2E:
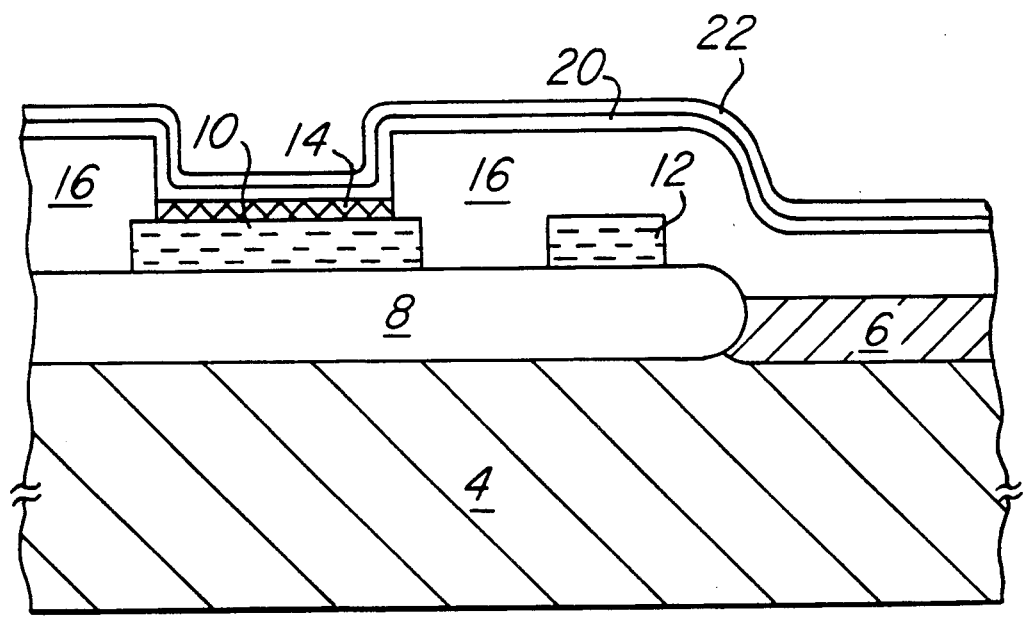

The capacitor dielectric material is now deposited over the surface of the integrated circuit, and contacting silicide film 14 at the location at which the capacitor 2 is to be formed, as shown in FIG. 2e. In this embodiment, the capacitor dielectric consists of a 25 nm thick silicon dioxide layer 20, over which a 25 nm thick silicon nitride layer 22 is formed. Preferably, both layer 20 and layer 22 are formed by way of low pressure chemical vapor deposition, which can be done at relatively low temperatures (for example, on the order of, or less than, 800 degrees Celsius).

An example of such a method for forming layers 20 and 22 is described in U.S. Pat. No. 4,697,330, issued Oct. 6, 1987 and assigned to Texas Instruments Incorporated. After deposition of layers 20 and 22 by way of CVD, a densification in an inert or an oxygen atmosphere at a temperature on the order of 800 degrees Celsius may be done. The low temperature of formation of layers 20 and 22 by LPCVD reduces additional vertical and lateral diffusion of diffusion 6.

It should be noted that a single layer of dielectric material, such as a single layer of silicon dioxide or a layer of oxidized silicon nitride, may be alternatively used for the dielectric of capacitor 2. Additional layers of dielectric material, such as an oxide/nitride/oxide layered dielectric, or a nitride/oxide/nitride layered dielectric as described in U.S. Pat. No. 4,882,649, assigned to Texas Instruments Incorporated, may also be alternatively used for the capacitor dielectric.

Figure 2F:
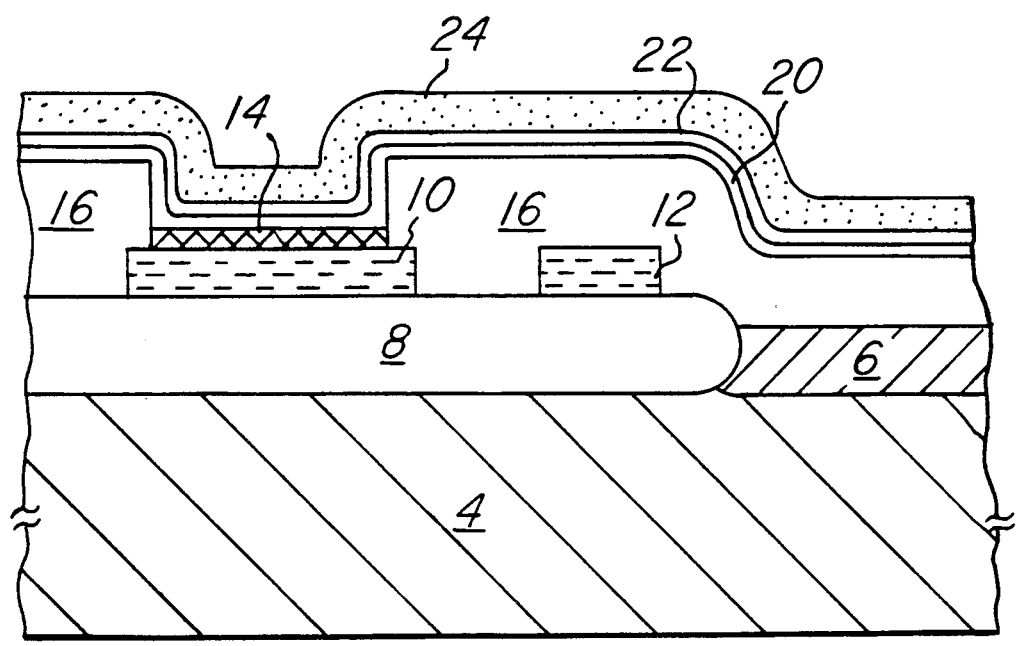

A preferred optional step in the formation of capacitor 2 is the formation of metal layer 24 over dielectric layers 20 and 22, prior to the etching of contacts to polysilicon structure 12 and to diffusion 6. FIG. 2f illustrates the integrated circuit with such a layer 24 formed. A preferred metal for the formation of layer 24 is a titanium-tungsten alloy, deposited to a thickness on the order of 50 nm. As will be described in detail below, the presence of layer 24 over the capacitor region will protect dielectric layers 20 and 22 during the contact formation steps.

Figure 2G:
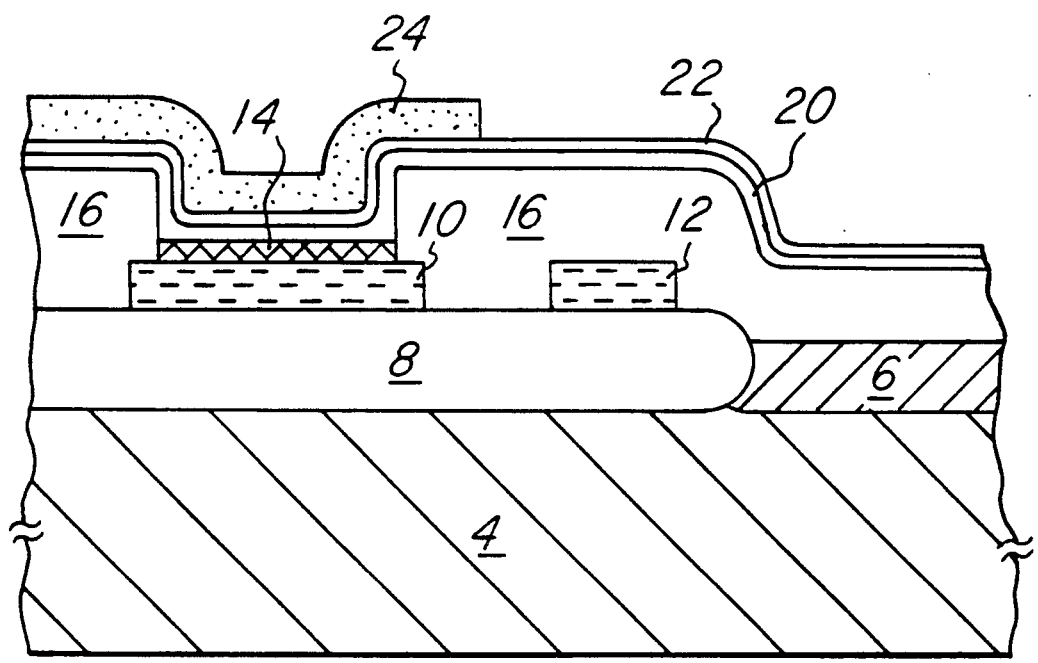

Metal layer 24 is then patterned and etched such that only the capacitor is covered by layer 24, as shown in FIG. 2g. This step is desired before contact vias 26 and 28 are formed because the metal's reflectivity makes forming the contact vias more difficult.

Figure 2H:
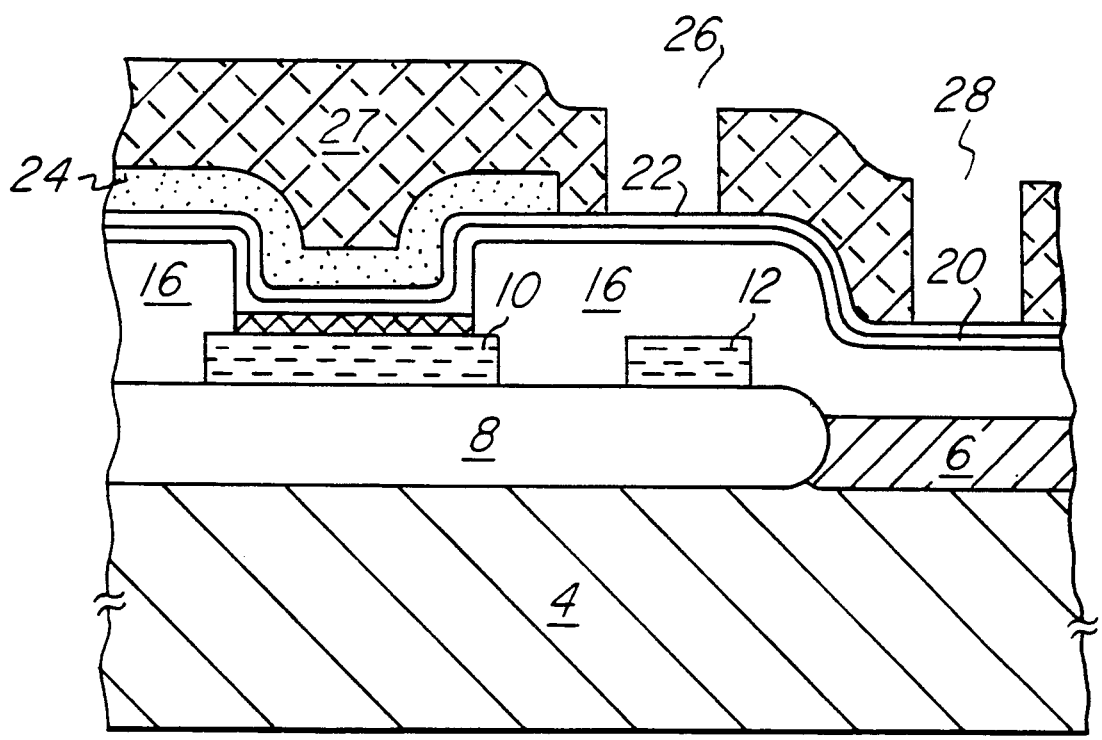
Figure 2I:
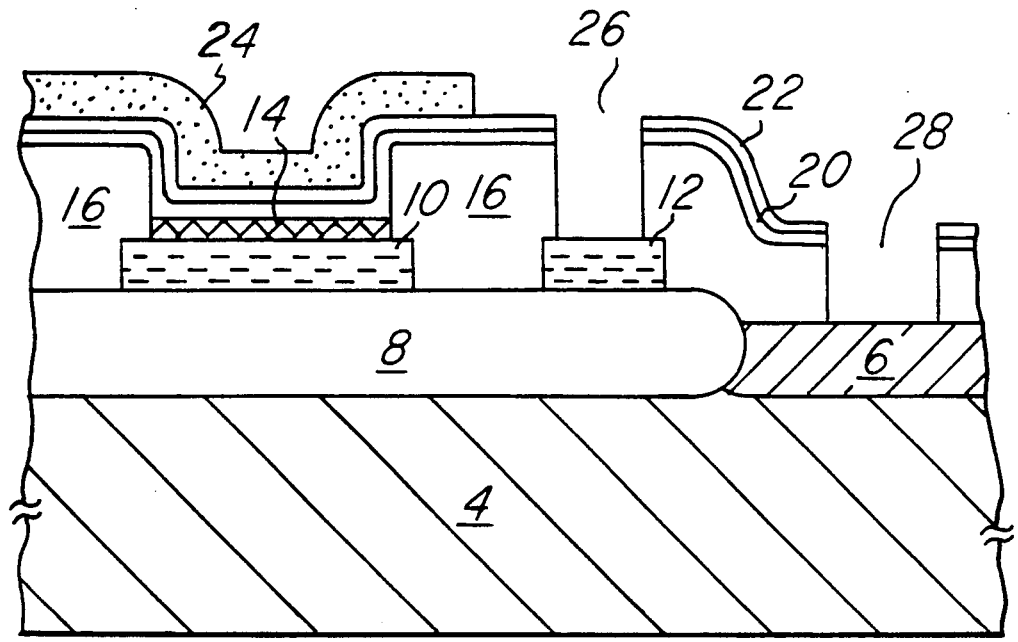

Referring now to FIG. 2h, a layer of masking material 27, for example photoresist, is shown on the surface of metal layer 24 and dielectric layer 22. Masking material 27 is exposed and developed according to conventional photolithography techniques to define contact locations 26 (to polysilicon structure 12) and 28 (to diffusion 6). The structure is then subjected to a plasma etch (or alternatively a wet etch) to etch through dielectric layers 22, 20 and 16, so as to expose polysilicon structure 12 at contact location 26, and diffusion 6 at contact location 28. Masking material 27 is then removed, resulting in the structure shown in FIG. 2i.

It should be noted that metal layer 24 remains in place over dielectric layers 20 and 22 in the location at which capacitor 2 is to be formed. It is common in conventional semiconductor processing to perform a deglaze, consisting of a plasma sputter etch, or a dip of the wafer in hydrofluoric acid, for example, after the etch of contact vias and prior to the deposition of metallization. Such a deglaze clears the structures to which contact is to be made, for example, polysilicon 12 at contact location 26 and diffusion 6 as contact location 28, of any native oxide which may form subsequent to the contact etch and prior to the metallization deposition. The presence of native oxide at the contact locations 26 and 28 will, of course, cause the contacts to become resistive. This deglaze will, of course, also etch other exposed dielectric material; if the capacitor dielectric layers 20 and 22 are exposed to the deglaze, layers 20 and 22 will, of course, be themselves etched thereby. The presence of metal layer 24, however, protects layer 22 from the deglaze, maintaining the dielectric of capacitor 2 as deposited.

Alternatively to the provision of metal layer 24, layer 22 could be deposited to a greater thickness in order that the resultant thickness of layers 20 and 22 is as desired after the deglaze step; this requires that the deglaze be performed under controlled conditions. Further alternatively, the wafer could be maintained in an oxygen-free environment after the contact etch, and prior to metal deposition, precluding the formation of native oxide at contact locations 26 and 28. The use of metal layer 24, however, removes these constraints on the deglaze, and on the storage of material after contact etch, without requiring an additional mask step.

Figure 2J:
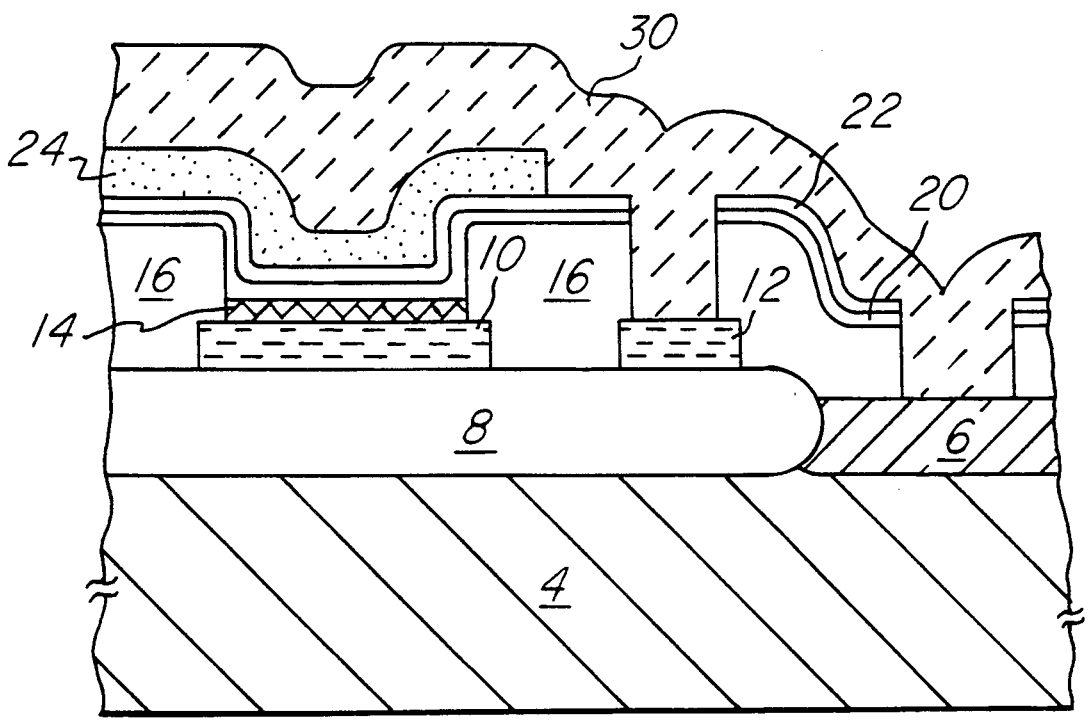

Referring now to FIG. 2j, metal layer 30 is deposited over the structure after contact etch and deglaze. Metal layer 30 can be any known composition suitable for the formation of integrated circuits. An example of metal layer 30 is an alloy of titanium-tungsten, on the order of 300 nm thick, underlying a layer copper-doped aluminum sputtered to a thickness on the order of 750 nm. It should be noted that the sputtering of metal layer 30 is generally also done at a relatively low temperature (on the order of 350 degrees Celsius). The thickness of metal layer 30 is, of course, sufficient to fill contact locations 26 and 28 to polysilicon structure 12, and diffusion 6, as well as to fill the depression over polysilicon structure 10 in the location of capacitor 2. A mask is patterned over metal layer 30 to define the locations of the metal lines on the integrated circuit, and metal layer 30 and metal layer 24 are both etched by a known metal etch. Metal layers 24 and 30 are, of course, cleared from the surface of dielectric layers 20 and 22 at the locations where no metal connection is to be made. As a result, the structure shown in FIG. 1 is fabricated.

Figure 3:
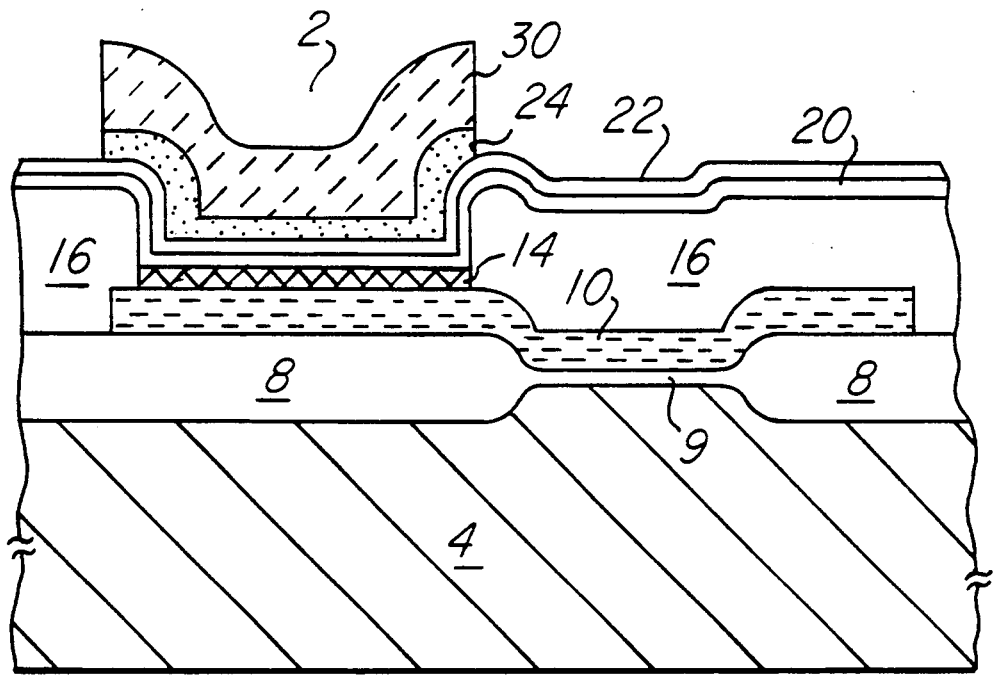
FIG. 3 is a cross-sectional view of floating-gate transistor constructed according to the invention.
Figure 4:
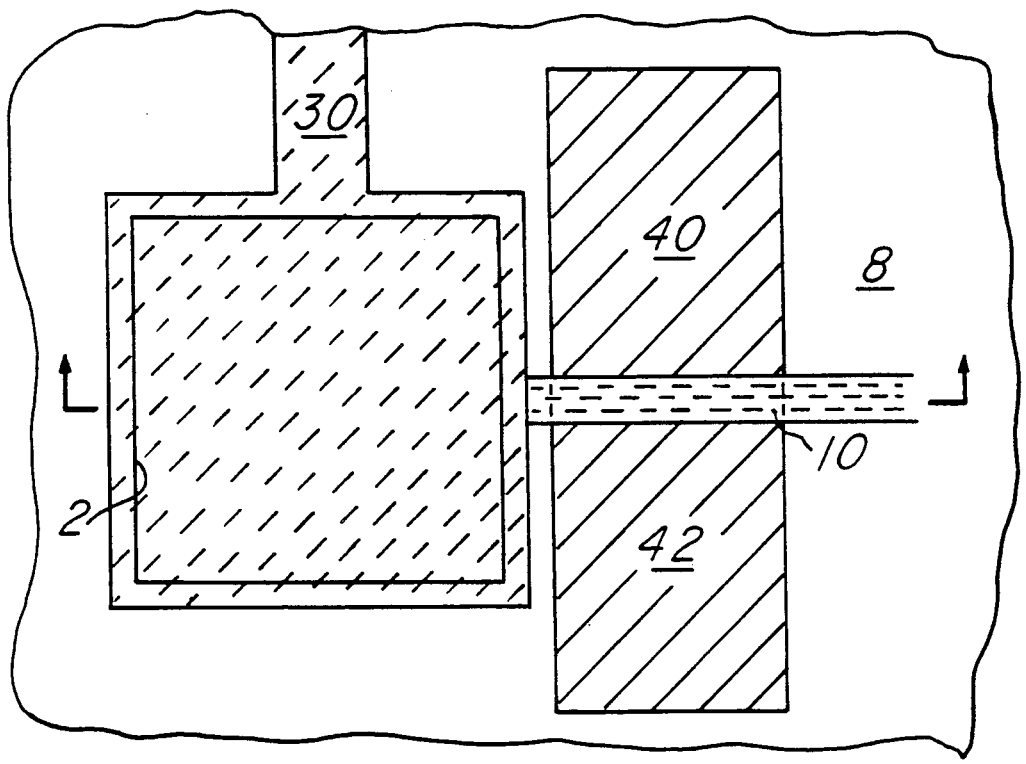
FIG. 4 is a plan view of the floating-gate transistor of FIG. 3.

Referring now to FIGS. 3 and 4, a floating-gate transistor is shown incorporating capacitor 22 formed substantially as described above. Like reference numerals are used in FIGS. 3 and 4 as were used in FIGS. 1 and 2a through 2i.

Referring to FIG. 3, capacitor 2 is shown substantially as in FIG. 1. Polysilicon 10, however, extends from under capacitor 2 off the edge of field oxide 8 so as to overly a thin gate oxide layer 9 in a moat region. As shown in plan view in FIG. 4, polysilicon 10 separates n-type diffusion regions 40 and 42, diffusion 40 serving as the drain of an MOS transistor and diffusion 42 serving as the source. Polysilicon 10 extends onto field oxide 8 on the opposite side of the moat region from capacitor 2, and is electrically isolated.

The floating gate transistor of FIGS. 3 and 4 thus has polysilicon 10 as the floating gate, and metal layers 24 and 30 (i.e., the top plate of capacitor 2) as the control gate. Capacitor 2 capacitively couples a signal placed on metal layer 30 to polysilicon 10, allowing for the programming and reading of the floating-gate transistor of FIGS. 3 and 4 in the manner conventional for electrically programmable read-only-memory (EPROM) devices and electrically erasable programmable read-only-memory (EEPROM) devices.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A method for fabricating a floating-gate transistor at a surface of a semiconductor body, said method comprising the steps of:
    forming a field dielectric structure at said surface, to define a moat region not covered by said field dielectric structure;
    forming source diffusion and a drain diffusion at said moat region;
    forming a floating gate, comprising polycrystalline silicon, said floating gate having a capacitor bottom plate section disposed over said field dielectric structure, and having a gate portion extending off of said field dielectric and disposed between said source and drain diffusions;
    forming a multilevel dielectric layer overall;
    removing a portion of said multilevel dielectric layer over said capacitor bottom plate section to expose a portion thereof;
    forming a silicide film, disposed on said exposed portion of said capacitor bottom plate section;
    forming a capacitor dielectric overall;
    removing a portion of said capacitor dielectric and said multilevel dielectric layer over said moat region to expose a portion thereof; and
    forming a patterned conductor layer, comprising a metal layer, with a first portion comprising a top plate disposed over and in contact with said capacitor dielectric layer at said capacitor bottom plate section, and a second portion disposed over and in direct contact with at least one of said source diffusion and said drain diffusion.

2. The method of claim 1, wherein said step of forming said top plate comprises:
    forming a first metal layer in contact with said capacitor dielectric prior to the step of removing a portion of said multilevel dielectric layer over said moat region; and
    forming a second metal layer in contact with said first metal layer after said step of removing a portion of said multilevel dielectric layer over said moat region, wherein said second metal layer is in direct contact with said exposed portion of said moat region.

3. The method of claim 2, wherein said first metal layer comprises titanium and tungsten.

4. The method of claim 1, wherein said step of forming a capacitor dielectric comprises:
    forming a layer of silicon dioxide overall; and
    forming a layer of silicon nitride over said layer of silicon dioxide.

5. The method of claim 1, wherein said depositing steps are performed by way of low pressure chemical vapor deposition.

6. The method of claim 1, wherein said step of removing a portion of said multilevel dielectric layer over said capacitor bottom plate section to expose a portion thereof also exposes portions of said multilevel dielectric layer over said source or drain diffusions, and said step of forming a silicide film disposed on said exposed portion of said capacitor bottom plate section, also forms a silicide film on exposed portions of said source or drain diffusions.

* * * * *